United States Patent
Wang et al.

(10) Patent No.: US 7,061,412 B1
(45) Date of Patent: Jun. 13, 2006

(54) APPARATUS, METHOD AND DIGITAL-TO-ANALOG CONVERTER FOR REDUCING HARMONIC ERROR POWER

(75) Inventors: Shiao-Feng Wang, Hsinchu (TW); Cheng-Yuan Chen, Taipei (TW)

(73) Assignee: Sunplus Technology Co., Ltd., Hsinchu (TW)

( * ) Notice: Subject to any disclaimer, the term of this patent is extended or adjusted under 35 U.S.C. 154(b) by 0 days.

(21) Appl. No.: 11/160,663

(22) Filed: Jul. 5, 2005

(30) Foreign Application Priority Data

Mar. 8, 2005 (TW) ............................. 94106902 A

(51) Int. Cl.
*H03M 1/06* (2006.01)
(52) U.S. Cl. .................. 341/118; 341/120; 341/145
(58) Field of Classification Search ............ 341/118, 341/120, 144–154, 139, 142, 143
See application file for complete search history.

(56) References Cited

U.S. PATENT DOCUMENTS

| | | | | |
|---|---|---|---|---|
| 4,958,155 A | * | 9/1990 | Gulczynski | 341/120 |
| 5,017,918 A | * | 5/1991 | Matsusako | 341/118 |
| 5,760,726 A | | 6/1998 | Koifman et al. | 341/145 |
| 5,790,060 A | * | 8/1998 | Tesch | 341/119 |
| 6,118,398 A | * | 9/2000 | Fisher et al. | 341/144 |
| 6,707,404 B1 | * | 3/2004 | Yilmaz | 341/120 |
| 6,927,714 B1 | * | 8/2005 | Teterwak | 341/136 |
| 6,967,609 B1 | * | 11/2005 | Bicakci et al. | 341/144 |

FOREIGN PATENT DOCUMENTS

WO   WO 03/100982 A1   12/2003

* cited by examiner

*Primary Examiner*—Rexford Barnie
*Assistant Examiner*—Linh V. Nguyen
(74) *Attorney, Agent, or Firm*—Jianq Chyun IP Office

(57) ABSTRACT

An apparatus, method and digital-to-analog converter (DAC) for reducing harmonic error power is provided, suitable for current-mode self-calibration DAC. Unit currents are calibrated one by one based on a reference value and the error distribution of the unit currents appears identical characteristic. According to the calibrated current error distribution, a shift shifts the input digital signal so that the error distribution of the unit current selected by the digital signal is monotonicity and not related to self-calibration current period. A coarse decoder decodes the digital signal as compensation decoding. The harmonic power related to the self-calibration current period is greatly reduced, which improves the signal to noise ratio.

14 Claims, 7 Drawing Sheets

FIG. 4 — thermometer decoding without shift

FIG. 5 — compensation decoding with shift

|  | thermometer decoding without shift | | | compensation decoding with shift | | |
|---|---|---|---|---|---|---|
|  | INL(LSB) | DNL(LSB) | SNDR(dB) | INL(LSB) | DNL(LSB) | SNDR(dB) |
| LSB/2 | [−4~+4] | [−1/2~+1/2] | 84 | [−0.5~+0.5] | [−0.5~+0.5] | 97.7 |
| LSB/4 | [−2~+2] | [−1/4~+1/4] | 88 | [−1/4~+1/4] | [−1/4~+1/4] | 98.1 |
| LSB/8 | [−1~+1] | [−1/8~+1/8] | 94 | [−1/8~+1/8] | [−1/8~+1/8] | 98.4 |
| LSB/16 | [−0.5~+0.5] | [−1/16~+1/16] | 96.9 | [−1/16~+1/16] | [−1/16~+1/16] | 98.5 |
| LSB/32 | [−1/4~+1/4] | [−1/32~+1/32] | 97.8 | [−1/32~+1/32] | [−1/32~+1/32] | 98.6 |

APPARATUS, METHOD AND DIGITAL-TO-ANALOG CONVERTER FOR REDUCING HARMONIC ERROR POWER

CROSS-REFERENCE TO RELATED APPLICATION

This application claims the priority benefit of Taiwan application serial no. 94106902, filed on Mar. 8, 2005. All disclosure of the Taiwan application is incorporated herein by reference.

BACKGROUND OF THE INVENTION

1. Item of Invention

The present invention relates to an apparatus and method for reducing harmonic error power, and more particularly, relates to an apparatus and method for reducing harmonic error power in a self-calibration digital-to-analog converter (DAC).

2. Description of Related Art

Current mode digital-to-analog converters (DAC) are popular in high-speed application. Currents are switched to outputs or ground by switches. The output currents are transformed into voltages by resistors and amplifiers. Open/short operations of switches are controlled by digital signals. However, glitch and harmonic power occur in state transition of switches. There are several approaches for reducing glitches. For example, one approach is to limit bandwidth, by adding a capacitor in a resistor across the amplifier coupled to outputs. Another approach is to "sample and hold" output signals. Or, in still another approach, the output signals are decoded by binary decoding or thermometer decoding. Thermometer decoding is more popular.

Thermometer decoding is not minimal. On the contrary, an N-bit input matches up to 2N outputs in binary decoding. Thermometer decoding has other advantages, such as lower differential nonlinearity (DNL) errors, monotonicity and reduced glitch errors.

Dynamic calibration by current switches is useful in making stable current sources with up to 16-bit precision in audio-frequency DAC. In circuit design, current sources are mismatched because of mismatch transistors and charge injection. For match between current sources, all current sources are periodically calibrated by a reference current source via a shift register. For example, if a current source outputting current Id1 is calibrated, the reference current source calibrates another current source outputting current Id2 as Id1, and so on.

However, in self-calibration, all unit current sources are calibrated to a reference value. After calibration, the currents from the calibrated unit current sources are attenuated linearly. If an offset between one output current and the reference value reaches a half of LSB (least significant bit) or more, that unit current source has to be calibrated again. However, large harmonic power exists in outputs. The harmonic power is related to the calibration periods. That's because the unit current sources are selected by simple and conventional thermometer decoding.

SUMMARY OF THE INVENTION

One embodiment of the invention is to provide an apparatus for reducing harmonic error power, suitable in a current-mode self-calibration digital-to-analog converter (DAC), including a coarse decoder and a shift for improving selection sequence of current sources. SNR (signal to noise ratio) is improved.

Another embodiment of the invention is to provide a method for reducing harmonic error power, wherein selection sequence of current sources is achieved by coarse decoding, instead of conventional thermometer decoding. INL (integral nonlinearity) is reduced and SNDR (signal-to-noise plus distortion ratio) is improved.

Still another embodiment of the invention is to provide a current-mode self-calibration digital-to-analog converter (DAC).

In one embodiment of the invention, is provided an apparatus for reducing harmonic error power, in a current-mode self-calibration digital-to-analog converter (DAC), including a shift register, a coarse decoder, a shift, a unit current array, a calibration switch network and a current switch. The shift register outputs a shift timing signal. The coarse decoder receives and decodes a digital signal to output a compensation decoding signal. The shift, coupled to the shift register and the coarse decoder, shifts the compensation decoding signal based on the shift timing signal and outputs a shifted compensation decoding signal. The unit current array includes a plurality of unit current sources for outputting unit currents. The calibration switch network, coupled to the shift register and the unit current array, calibrates the current sources from the unit current sources based on the shift timing signal and a reference current, and outputs calibrated unit currents. The current switch, coupled to the shift and the calibration switch network, includes a plurality of switches for receiving the calibrated unit currents, conducts or blocks the calibrated unit currents based the shifted compensation signal and outputs the conducted calibrated unit currents as an analog current signal.

The apparatus further includes a reference current source outputting the reference current.

The shift and the calibration switch network are synchronized based on the shift timing signal, and the shift shifts a bit if one of the unit currents is calibrated.

After calibration by the calibration switch network, error distribution of the unit currents from the unit current array is in monotinicity.

The compensation decoding by the coarse decoder is adjusted based on weights of the error distribution for reducing integral nonlinearity.

Offset between the unit current source and the reference current source is calibrated for preventing the offset equal or larger than LSB (least significant bit)/2, so that the error between any two unit current sources is less than LSB/2.

In another embodiment of the invention, is provided a method for reducing harmonic error power, including steps of providing a reference current and a plurality of unit currents; inputting a digital signal; performing a compensation decoding on the digital signal for outputting a compensation decoding signal; shifting the compensation decoding signal and outputting a shifted compensation decoding signal. The unit currents are calibrated one by one based on the reference current and then the calibrated unit currents are output, wherein the one-by-one calibration is synchronous with the shift of the compensation decoding signal. The calibrated unit currents are conducted or blocked based on the shifted compensation decoding signal and the conducted calibrated unit currents are output as an analog current signal.

The error distribution of the calibrated unit currents is in monotinicity.

The compensation decoding signal is adjusted based on weights of the error distribution for reducing integral non-linearity.

An offset between the unit current and the reference current is calibrated for preventing the offset equal or larger than LSB (least significant bit)/2, so that the error between any two unit currents is less than LSB/2.

In yet another embodiment of the invention, is provided a digital-to-analog converter (DAC) of a current-mode self-calibration type, converting a digital signal into an analog signal, the digital signal comprising a low-bit digital signal and a high-bit digital signal. The DAC includes a delay unit, a LSB (least significant bit) conversion circuit and a MSB (most significant bit) conversion circuit. The delay unit receives and delays the low-bit digital signal. The LSB conversion circuit, coupled to the delay unit, converts the delayed low-bit digital signal into a low-bit analog current signal. The MSB conversion circuit reduces harmonic error power and converts input high-bit digital signal into high-bit analog current signal. The MSB conversion circuit includes the above apparatus for reducing harmonic error power. The low-bit and high-bit analog current signals are combined as the analog current signal.

The LSB conversion circuit includes a low-bit current switch and a binary current divider. The low-bit current switch, coupled to the delay unit, includes a plurality of switches, conducts or blocks low-bit unit currents based on the delayed low-bit digital signal, and outputs the conducted low-bit unit currents as the low-bit analog current signal. The binary current divider, coupled to the low-bit current switch, divides unit currents into low-bit unit currents based on binary weights and outputting the low-bit unit currents to the low-bit current switch.

Via the apparatus, the method and the DAC which reduces harmonic error powers, the harmonic waves, related to the self-calibration period, of the output from self-calibration DAC is significantly reduced. The unit currents are calibrated one by one based on a reference current, so the error distribution of the calibrated unit currents is in monotonicit. Besides, a coarse decoder and a shift are included in the MSB conversion circuit, the input digital signal is decoded and shifted based on the error distribution of the calibrated unit currents. The shift is synchronous with the calibration for reducing INL (integral nonlinearity) and harmonic power. SNR (signal to noise ratio) and SNDR (Signal-to-noise plus distortion ratio) are improved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 4 shows another conventional thermometer decoding without shift, wherein calibration errors are shifted but decoding bits are not shifted.

FIG. 5 shows a compensation decoding with shift according to a preferred embodiment of the present invention.

FIG. 7 shows a comparison table of the conventional thermometer decoding without shift and the present compensation decoding with shift.

DESCRIPTION OF THE PREFERRED EMBODIMENTS

Figure 1:
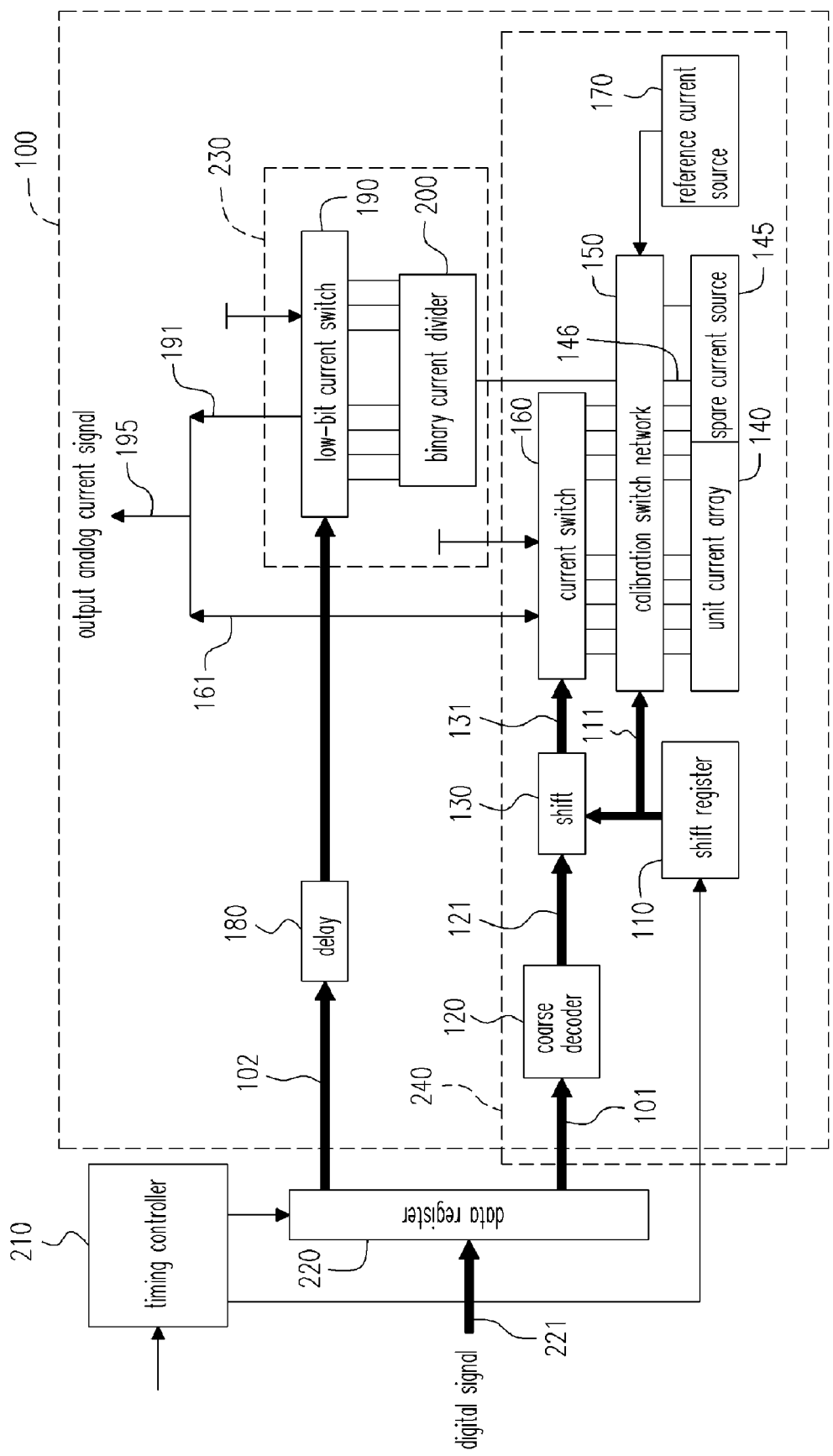
FIG. 1 is a block diagram of a digital-to-analog converter (DAC) according to a preferred embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Referring to FIG. 1, which is a block diagram of a digital-to-analog converter (DAC) according to a preferred embodiment of the present invention. The DAC 100 in FIG. 1 is of a current-mode self-calibration type. The DAC 100 converts an input digital signal 221, buffered in a data register 220, into an output analog current 195. The DAC 100 includes a delay 180, an LSB (Least Significant Bit) conversion circuit 230 and an MSB (Most Significant Bit) conversion circuit 240. In FIG. 1, although a timing controller 210 and the data register 220 are not included in the DAC 100, but the timing controller and the data register may be included in the DAC, if necessary.

In FIG. 1, the timing controller 220 is coupled to the data register 220 and a shift register 110 in the MSB conversion circuit 240. The data register 220 separates the digital signal 221 into high bits 101 and low bits 102. The high bits (for example, 6 bits) 101 are output to the MSB conversion circuit 240. The low bits (for example, 10 bits) 102 are output to the LSB conversion circuit 230 via the delay 180.

The delay 180 receives and delays the low bits 102, and then outputs delayed low bits. The LSB conversion circuit 230 receives the delayed low bits from the delay 180 and converts into a low-bit analog current signal 191. The MSB conversion circuit 240, which reduces harmonic error power, converts the high bits 101 into a high-bit analog current signal 161. The high-bit and low-bit analog current signals 161 and 191 are added into an output analog current signal 195.

Most of signal noise or harmonic power is from the MSB conversion circuit 240 and a little of which comes from the delay 180 and the LSB conversion circuit 230. Reducing noise sources of the MSB conversion circuit 240 is helpful in reducing harmonic error power of the current-mode self-calibration DAC.

The major noise sources of the MSB conversion circuit 240 are from switch units, for example, a current switch 160 and a calibration switch network 150. Glitch and harmonic power occurs in ON/OFF transition of switch units. The precision of a unit current array 140 is improved by calibration. The calibration switch network 150 calibrates the unit currents, one after one, from the unit current array 140 based on a shift timing signal 111 from the shift register 110 and a reference current from a reference current source 170. For example, the unit current array 140 provides 65 unit currents, or, the unit current array 140 includes 65 unit current sources. After calibration, the calibrated unit current is the same as the reference current. As time elapses, the unit current is attenuated linearly. After the 65th unit current is calibrated, the distribution between the 65 unit currents is monotonically attenuated. Current error reaches maximum between a previously calibrated unit current and a next unit current to be calibrated. Usually, the current error is calibrated before it reaches a half of LSB. So, error between any two unit currents is not over a half of LSB.

A spare current source 145, one of the 65 unit current sources and included in the unit current array 140, is coupled to the calibration switch network 150. The spare current source 145 outputs a spare current during calibration operation.

The current switch 160 includes multiple switches, each receiving one of calibrated unit currents. The switches in the current switch 160 conduct or block the calibrated unit currents based on a shifted compensation decoding signal 131 from the shift 130. The calibrated unit currents output from the current switch 160 are added as the high-bit analog current signal 161.

After calibration of the unit current array 140 by the calibration switch network 150, error characteristics between unit currents are monotonicity. A coarse decoder 120 and the shift 130 have function of reducing glitch and accordingly harmonic error power. So, the present invention has advantages over the conventional thermometer decoding.

Figure 2:
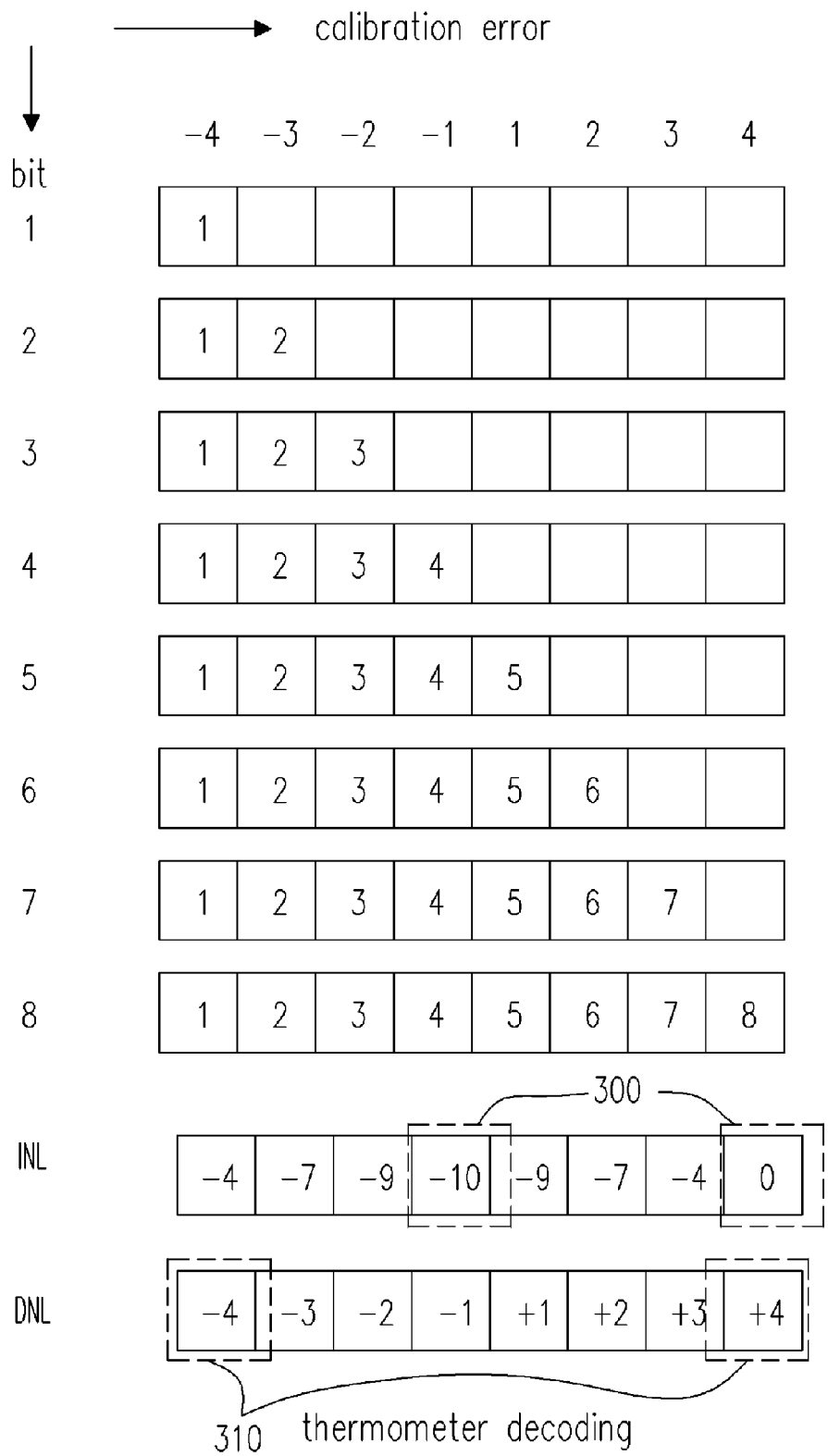
FIG. 2 shows a conventional thermometer decoding.

The difference and advantages of the present compensation decoding from the conventional thermometer decoding are described later. An 8-bit decoding is exemplary. Referring to FIG. 2, which shows a conventional thermometer decoding. In FIG. 2, the left shows bits and the top shows weights of current errors. The errors of first to eighth bits (1)~(8) are −4, −3, −2, −1, 1, 2, 3 and 4, respectively. The bottom of FIG. 2 shows INL (integral nonlinearity) and DNL (differential nonlinearity) of the corresponding bits. The first item in INL means the summation error of the first one bit, which is −4. The second item in INL means the summation error of the first two bits, which is (−4)+(−3)=−7. The third item in INL means the summation error of the first three bits, which is (−4)+(−3)+(−2)=−9, and so on. So, the last (eighth) item in INL means the summation error of all eight bits is (−4)+(−3)+(−2)+(−1)+1+2+3+4=0. The item in DNL is the result of the corresponding INL item minus a preceding INL item or 0, if no preceding INL item. The first item in DNL is the first INL item minus 0, which is (−4)−0=−4. The second item in DNL is the second INL item minus the first INL item, which is (−7)−(−4)=−3, and so on. The last (eighth) item in DNL is the last (eighth) INL item minus the preceding (seventh) INL item, which is 0−(−4)=+4. As shown in FIG. 2, INL ranges between 0~(−10), and DNL ranges between (−4)~(+4).

Figure 3:
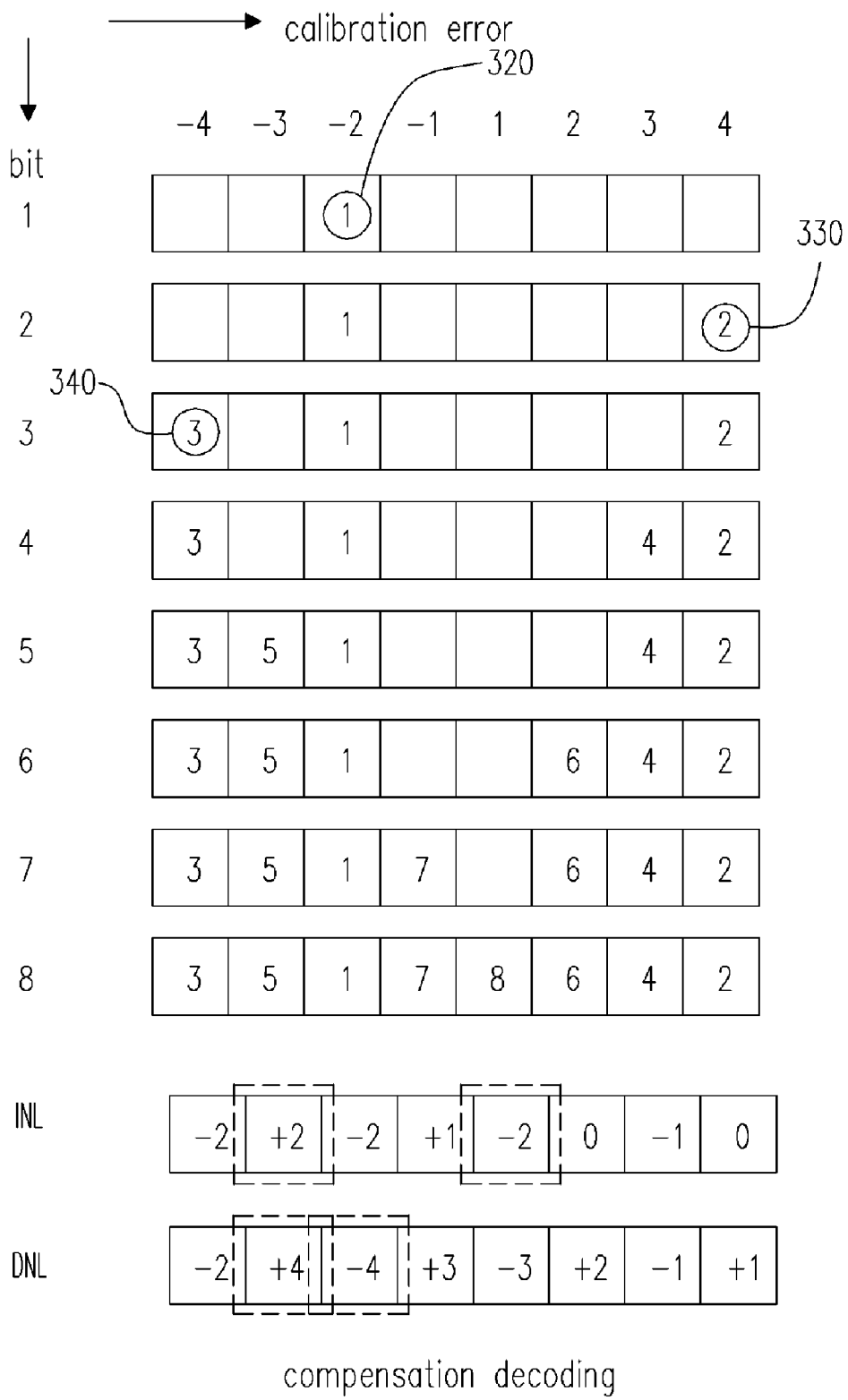
FIG. 3 shows a compensation decoding according to a preferred embodiment of the present invention.

FIG. 3 shows a compensation decoding according to a preferred embodiment of the present invention. The first bit is located at 320, corresponding to a current error with (−2). The second bit is located at 330, corresponding to a current error with (+4). The third bit is located at 340, corresponding to a current error with (−4), and so on. INL ranges between (−2)~(+2), and DNL ranges between (−4)~(+4). Compared with thermometer decoding of FIG. 2, INL is significantly reduced the compensation decoding.

In practice, the current errors are monotinically attenuated and then calibrated at maximum error by the reference current source. All unit currents from unit current sources are in this kind of trend, but with different attenuation amounts.

FIG. 4 shows another conventional thermometer decoding without shift, wherein calibration errors are shifted but decode bits are not shifted. An 8-bit thermometer decoding is exemplary. As shown in FIG. 4, without shift, current error of the first bit 350 is attenuated to −4, +4, +3, +2, +1, −1, −2 and −3 as time elapse. The INL in FIG. 4 is within the range of (−4)~(+6), and DNL is within (−4)~(+4).

FIG. 5 shows a compensation decoding with shift according to a preferred embodiment of the present invention. In case of shift, initially, current error of a first bit 360 is (−2). In next shift period, the first bit 360 is shifted right by one bit, so current error of the first bit 360 is still (−2). It is obvious that INL is significantly improved in compensation decoding with shift. The INL in FIG. 4 is within the range of (−4)~(+2), and DNL is still within (−4)~(+4).

The shift period should be matched with the calibration of unit current by the calibration switch network, so that in calibration of anyone unit current, the shift 130 shifts one bit. Please referring back to FIG. 1, the shift register 110 provides a shift signal 111 to synchronize the shift 130 and the calibration switch network 150.

The harmonic wave on the output is because of periodical change of INL. The change period of INL is based on number of current sources.

Figure 6:
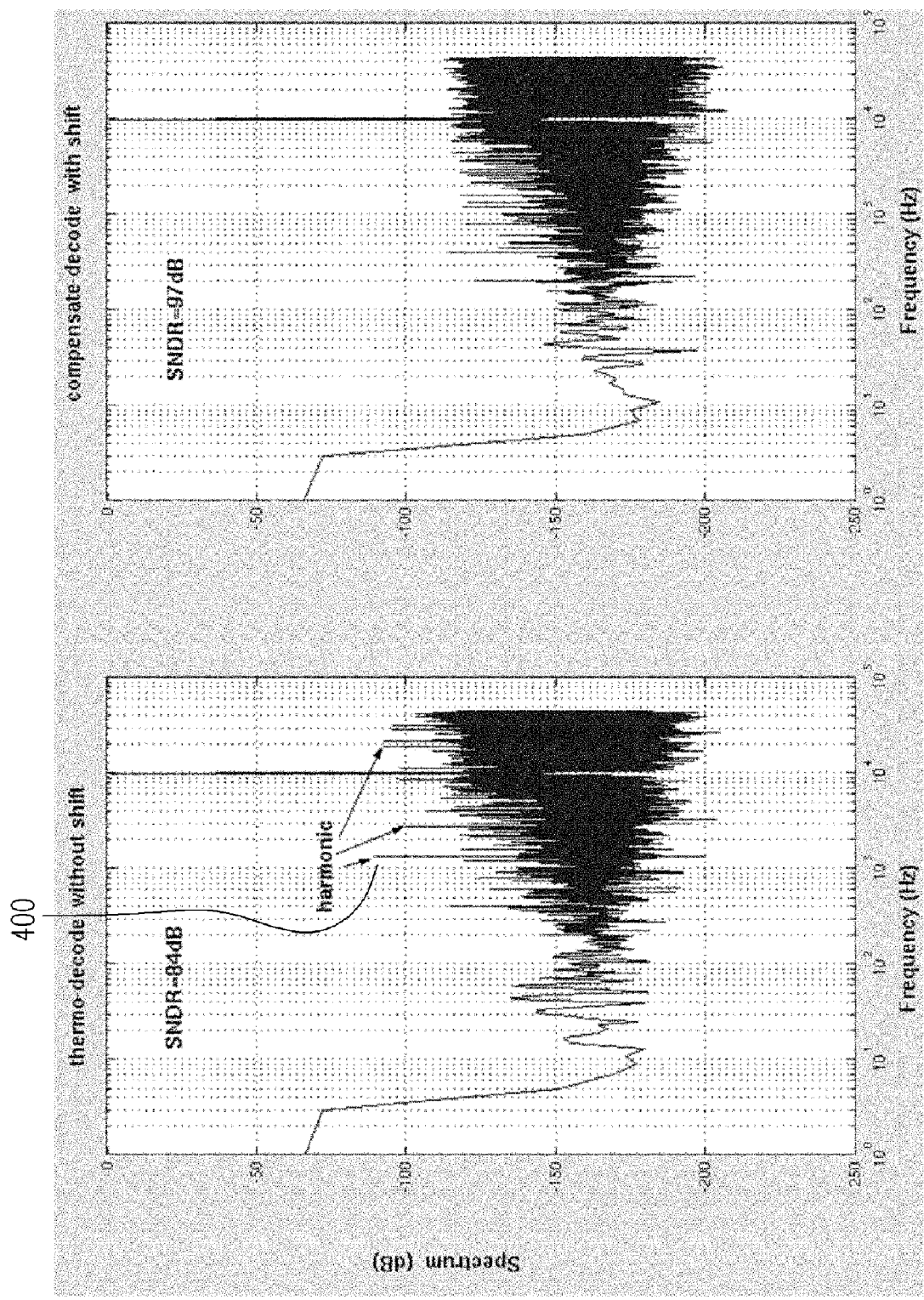
FIG. 6 shows spectrum analysis of the conventional thermometer decoding without shift and the present compensation decoding with shift.

FIG. 6 shows spectrum analysis of the conventional thermometer decoding without shift and the present compensation decoding with shift. In case of an input sinusoidal signal with 5 KHz, a maximum error is LSB/2. On the left of FIG. 6 shows the conventional thermometer decoding without shift. A large harmonic wave 400 occurs at a sampling frequency fs/65. On the right of FIG. 6 shows the present compensation decoding with shift. The harmonic waves are under −100 db. Signal-to-noise plus distortion ratio (SNDR) in the present compensation decoding with shift is larger that SNDR in the conventional thermometer decoding without shift by 13 db.

FIG. 7 shows a comparison of the conventional thermometer decoding without shift and the present compensation decoding with shift. INL in the present invention is only one-eighth of the conventional INL, DNL maintains and a maximum SNDR 450 is larger by 13 db.

Figure 8:
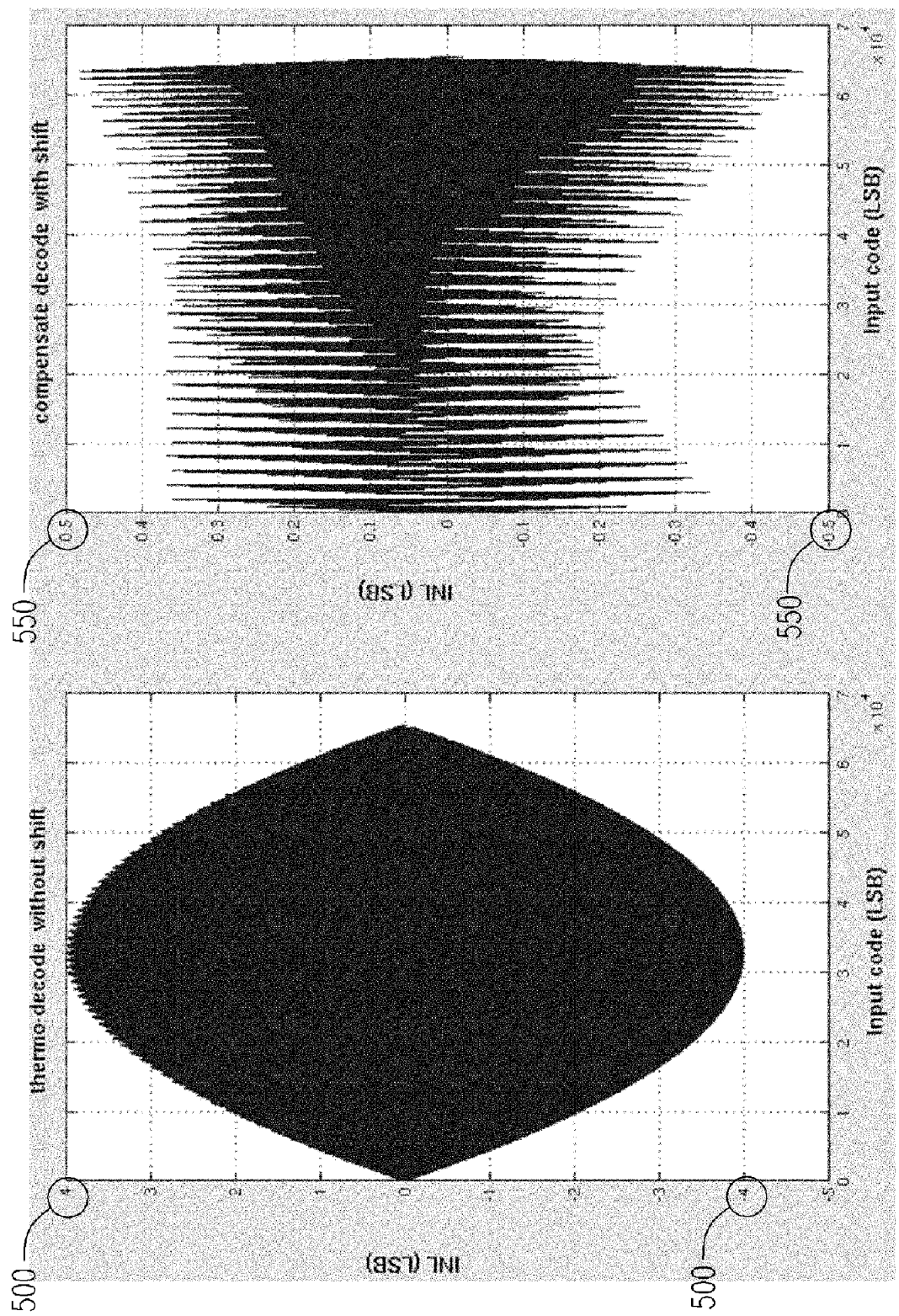
FIG. 8 shows integral nonlinearity errors of the conventional thermometer decoding without shift and the present compensation decoding with shift.

FIG. 8 shows integral nonlinearity (INL) errors of the conventional thermometer decoding without shift and the present compensation decoding with shift. As shown in left of FIG. 8, INL in the conventional thermometer decoding without shift is within (−4)~(+4). As shown in right of FIG. 8, INL in the present compensation decoding with shift is within (−0.5)~(+0.5), which is only one-eighth of the conventional INL.

Please refer back to FIG. 1 for explanation of the low-bit analog current signal 191. A part of unit currents output from the calibration switch network 150 is input and divided by a binary current divider 200 based on binary weights. A low-bit current switch 190, coupled to the delay 180, conducts or disconnects low-bit unit current based on a delayed low-bit digital signal 102 from the delay 180. The conducted low-bit unit currents from the current switch 190 are added as the low-bit analog current signal 191.

As discussed above, in design of 16-bits audio-frequency DAC by the present invention, if the high-bit digital signal is 6 bits, or said the low-bit digital signal is 10 bits, the compensation decoding signal has $2^6=64$ bits, which means there are 64 highly precision unit currents in signal switch. If the compensation decoding signal 131 from the shift 130 includes "0101", during switch operations of the current switch 160, the switch receiving "1" outputs the unit current and the switch receiving "0" blocks the unit current.

In the preferred embodiment, there are 65 unit current sources to be calibrated, one of them being the spare current source 145. The 64th unit current outputs unit current to the binary current divider via the calibration switch network 150. Of course, the present invention is not limited by 65 unit current sources.

As discussed above, a method for reducing harmonic error power is implied and its detailed description is omitted.

Via the DAC which reduces harmonic error powers based on the invention, the harmonic waves, related to the self-calibration period, of the output from self-calibration DAC is significantly reduced and SNR is improved. The invention transforms 2-dimension error analysis into one-dimension error analysis, and accordingly, the complexity is reduced but the compensation effect is still good.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. An apparatus for reducing harmonic error power, in a current-mode self-calibration digital-to-analog converter (DAC), comprising:
   a shift register, outputting a shift timing signal;
   a coarse decoder, receiving and decoding a digital signal to output a compensation decoding signal;
   a shift, coupled to the shift register and the coarse decoder, shifting the compensation decoding signal based on the shift timing signal and outputting a shifted compensation decoding signal;
   a unit current array, comprising a plurality of unit current sources for outputting unit currents;
   a calibration switch network, coupled to the shift register and the unit current array, calibrating the unit currents from the plurality of unit current sources based on the shift timing signal and a reference current and outputting calibrated unit currents; and
   a current switch, coupled to the shift and the calibration switch network, comprising a plurality of switches for receiving the calibrated unit currents and conducting or blocking the calibrated unit currents based on the shifted compensation signal, outputting the conducted calibrated unit currents as an analog current signal.

2. The apparatus of claim 1, further comprising a reference current source outputting the reference current.

3. The apparatus of claim 1, wherein the shift and the calibration switch network are synchronized based on the shift timing signal, and wherein the shift shifts a bit if one of the unit currents is calibrated.

4. The apparatus of claim 3, wherein after calibration by the calibration switch network, error distribution of the unit currents from the unit current array is in monotinicity.

5. The apparatus of claim 4, wherein the compensation decoding by the coarse decoder is adjusted based on weights of the error distribution for reducing integral nonlinearity.

6. The apparatus of claim 4, wherein an offset between the unit current source and the reference current source is calibrated for preventing the offset equal or larger than LSB(least significant bit)/2, so that the error between any two unit current sources is less than LSB/2.

7. A method for reducing harmonic error power, comprising steps of:
   providing a reference current and a plurality of unit currents;
   inputting a digital signal;
   performing a compensation decoding on the digital signal for outputting a compensation decoding signal;
   shifting the compensation decoding signal and outputting a shifted compensation decoding signal;
   calibrating the unit currents one by one based on the reference current and outputting the calibrated unit currents, wherein the one-by-one calibration is synchronous with the shift of the compensation decoding signal; and
   conducting or blocking the calibrated unit currents based on the shifted compensation decoding signal and outputting the conducted calibrated unit currents as an analog current signal.

8. The method of claim 7, wherein error distribution of the calibrated unit currents is in monotinicity.

9. The method of claim 7, wherein the compensation decoding signal is adjusted based on weights of the error distribution for reducing integral nonlinearity.

10. The method of claim 7, wherein an offset between the unit current and the reference current is calibrated for preventing the offset equal or larger than LSB(least significant bit)/2, so that the error between any two unit currents is less than LSB/2.

11. A digital-to-analog converter (DAC) of a current-mode self-calibration type, converting a digital signal into an analog signal, the digital signal comprising a low-bit digital signal and a high-bit digital signal, the DAC comprising:
   a delay unit, receiving and delaying the low-bit digital signal;
   a LSB (least significant bit) conversion circuit, coupled to the delay unit, converting the delayed low-bit digital signal into a low-bit analog current signal; and
   a MSB (most significant bit) conversion circuit, reducing harmonic error power, comprising:
      a shift register, outputting a shift timing signal;
      a coarse decoder, receiving and decoding the high-bit digital signal to output a compensation decoding signal;
      a shift, coupled to the shift register and the coarse decoder, shifting the compensation decoding signal based on the shift timing signal and outputting a shifted compensation decoding signal;
      a unit current array, comprising a plurality of unit current sources, each outputting one unit current;
      a calibration switch network, coupled to the shift register and the unit current array, calibrating the current sources from the plurality of unit current sources based on the shift timing signal and a reference current and outputting calibrated unit currents; and
      a current switch, coupled to the shift and the calibration switch network, comprising a plurality of switches for receiving the calibrated unit currents, conducting or blocking the calibrated unit currents based on the shifted compensation signal, and outputting the conducted calibrated unit currents as a high-bit analog current signal;
   wherein the low-bit and high-bit analog current signals are combined as the analog current signal.

12. The DAC of claim 11, wherein the LSB conversion circuit comprises:

a low-bit current switch, coupled to the delay unit, comprising a plurality of switches, conducting or blocking low-bit unit currents based on the delayed low-bit digital signal, and outputting the conducted low-bit unit currents as the low-bit analog current signal; and
a binary current divider, coupled to the low-bit current switch, dividing a part of the calibrated unit currents into low-bit unit currents based on binary weights and outputting the low-bit unit currents to the low-bit current switch.

13. The DAC of claim 12, wherein the binary current divider receives the part of the calibrated unit currents from the calibration switch network.

14. The DAC of claim 11, wherein the unit current array comprises a spare current source, coupled to the calibration switch network, for outputting a spare unit current.

* * * * *